United States Patent [19]
Kamon

[11] Patent Number: 5,481,624
[45] Date of Patent: Jan. 2, 1996

[54] MASK INSPECTING METHOD AND MASK DETECTOR

[75] Inventor: Kazuya Kamon, Itami, Japan

[73] Assignee: Mitsubishi Denki Kabushiki Kaisha, Tokyo, Japan

[21] Appl. No.: 45,471

[22] Filed: Apr. 13, 1993

[30] Foreign Application Priority Data

Apr. 27, 1992 [JP] Japan .................................. 4-107683

[51] Int. Cl.⁶ .................................................. G06K 9/00
[52] U.S. Cl. .......................................... 382/144; 356/237
[58] Field of Search ..................... 382/8, 144; 358/101; 356/237, 394; 348/87; 355/53; 250/492.2

[56] References Cited

U.S. PATENT DOCUMENTS

| | | | |
|---|---|---|---|
| 4,641,353 | 2/1987 | Kobayashi | 382/8 |
| 4,902,899 | 2/1990 | Lin et al. | 250/492.1 |
| 5,045,417 | 9/1991 | Okamoto | 430/5 |
| 5,235,400 | 8/1993 | Terasawa et al. | 356/237 |
| 5,270,796 | 12/1993 | Tokui et al. | 356/394 |

*Primary Examiner*—Michael T. Razavi
*Assistant Examiner*—Jon Chang
*Attorney, Agent, or Firm*—Oblon, Spivak, McClelland, Maier & Neustadt

[57] ABSTRACT

A mask inspecting method for inspecting defects of a phase-shifting mask comprises the steps of converting pattern data of a designed circuit pattern to pattern data for a phase-shifting mask, manufacturing a phase-shifting mask as a function of the pattern data for a phase-shifting mask, detecting the phase-shifting mask using the same optical conditions as that of the exposure step in the process of manufacturing a semiconductor device which makes use of the phase shift method to obtain image data thereof and checking the image data with the pattern data of the designed circuit pattern. In the method, image data of the pattern data identical to a pattern transferred onto a semiconductor substrate can be obtained, so that it is possible to check the above pattern data with the pattern data of the circuit pattern. Thus, the inspection of the phase-shifting mask can be accomplished.

7 Claims, 14 Drawing Sheets

MASK INSPECTING METHOD AND MASK DETECTOR

BACKGROUND OF THE INVENTION

1. Field of the Invention

The present invention relates to a mask inspecting method for a phase-shifting mask and a mask detector for the inspection thereof in an exposure step of a process of manufacturing a semiconductor device.

2. Description of the Background Art

A lithography technique is usually used for forming a circuit pattern on a semiconductor substrate such as a wafer in a process of manufacturing a semiconductor device.

A method of manufacturing a semiconductor device using the lithography technique is as follows. A mask pattern of a photomask is transferred to a photoresist coating the surface of a wafer to form a resist pattern. The photoresist is developed, being partially removed according to the pattern, then a portion of the surface with the photoresist off is etched, to form a circuit pattern. Therefore, the accuracy of a mask pattern of the photomask exerts great influence on accuracy and electric characteristics of a semiconductor device.

For this reason, a photomask used in an exposure step of the process of manufacturing a semiconductor device has been conventionally made a sufficient inspection for its defects and drawing accuracy in advance.

FIG. 8 illustrates a principal part of a conventional photomask 70 used in the exposure step of the process of manufacturing a semiconductor device.

In the figure, numeral 71 denotes a glass substrate, on which a light shielding film 72 made of chromium and the like is formed by sputtering or the like.

The light shielding film 72 is provided with a pattern 73 of the similar shape, for example rectangular, to the pattern to be transferred to a photoresist surface on a wafer. (In FIG. 8, only one pattern 73 is illustrated for explanatory convenience.) The pattern 73 is transferred by light having a specific wavelength (ultraviolet region) onto the photoresist formed on a wafer surface to be developed, then through an etching step, an unnecessary photoresist is removed to form a circuit pattern on the wafer.

FIG. 9 is a block diagram of a conventional mask inspecting system 80 for inspecting defects of a pattern of the photomask 70.

A circuit pattern designed by a circuit designer with CAD and the like is stored as pattern data in a pattern data storage 81 made of magnetic disk or the like.

The pattern data are converted into electron beam data (referred to as "EB data" hereinafter) for operating an electron beam lithography system in an EB data generating part 82 to be stored in an EB data storage 83.

The above EB data serve to provide an on/off signal and position data of the electron beam employed in the device for operating an electron beam lithography system.

In a mask manufacturing part 84, the electron beam lithography system operates as a function of the EB data, performing the step of exposure of a resist of a masking material, then followed by the steps of development, etching and so on, thus manufacturing the photomask 70.

The photomask 70 thus manufactured is imaged by an image pickup device using an ordinary light source in a mask image pickup part 85, whereby image data associated with the pattern is obtained.

The mask image pickup part 85 has an image pickup device 90 of light transmissive type using a white light source 91, for example, as shown in FIG. 10.

White light L1 emitted from the light source 91 goes through a condenser lens 92, being converted into a parallel ray L2, to perpendicularly enter a mask surface of the photomask 70.

Light L3 passing through the pattern of the photomask 70 forms an image through a projection lens 93 on a two-dimensional photo array sensor 94, thus detecting a shape of the pattern.

Detection signals from the photo array sensor 94 are each converted into "0" or "1" according to a constant threshold value by a binary circuit 95, to thereby generate binary image data.

Furthermore, the image pickup device used in the mask image pickup part 85 is not limited to the light transmissive type which forms an image of the light passing through the pattern as described above, but it may be a reflective type which projects light onto the photomask 70 to form an image of a reflective light therefrom.

The image data of the pattern of the photomask 70 thus obtained is stored in an image data storage 86.

In a data checking part 87, the EB data and the corresponding image data are read out from the EB data storage 83 and the image data storage 86, respectively, and checked with each other.

The image data, being binary as mentioned above, are formed in the manner that if the value of the image data corresponding to the pattern 73 is "1", for example, that of the light-shielding film 72 is set for "0", so that the image data correspond in composition to the EB data which consist of an on/off signal of electron beam and position data. Therefore, when both data are simultaneously scanning in the same direction by means of CPU and the like, it can be checked whether or not both data coincide with each other by comparing the values of "0" and "1" one by one.

Thus, it can be inspected whether or not the mask pattern of the photomask 711 is precisely formed as a function of the predetermined EB data, i.e., it has any defect in size or shape.

Passing the inspection, the photomask 70 can be used in the exposure step of the process of manufacturing a semiconductor device.

Since the conventional photomask 70 has the same pattern 73 in shape as the designed circuit pattern, it can be sufficiently inspected by the above-described method. However, as for a phase-shifting mask which has been developed recently, there arises a problem that it is impossible to find defects thereof by the above method because the phase-shifting mask does not necessarily coincide in shape or size with a circuit pattern which is designed with CAD and the like.

In other words, a phase-shifting mask, which generally makes use of the effect of a phase shift method for improving a transferring accuracy of a pattern in the exposure step, is provided with a subsidiary pattern which is filled up with a phase reversing element (referred to as "phase shifter" hereinafter) for reversing light phase by 180° besides a main pattern, and is formed so that the edge of an exposed surface of the main pattern may be clearly defined by an interference of light passing through the main and subsidiary patterns.

The pattern of the phase-shifting mask is different from the circuit pattern previously designed in shape and size, therefore it is impossible to find any defect of the phase-shifting mask by checking both pattern images in a conventional inspecting system wherein the photomask is imaged just as it is by an ordinary white light to obtain image data to be inspected.

Further, more concrete description will be followed.

FIGS. 11(a) and 11(b) each illustrate a principal part of a phase-shifting mask.

FIG. 11(a) is a perspective view of a principal part of a phase-shifting mask 100 and FIG. 11(b) is a vertical section of the same.

A light-shielding film 102 is formed on a glass substrate 101 by evaporating a metal such as chromium, being provided with a main pattern 103 disposed substantially at the center thereof and subsidiary patterns 104 around the main pattern 103 parallel with each side of the main pattern 103 at a predetermined distance therefrom. Each of the subsidiary patterns 104 is filled up with a phase shifter 105 such as $SiO_2$.

The phase shifter 105 is made of transparent or translucent material. When light passes through it, a phase of the passing light is shifted by 180° in comparison with the case where light does not pass through it.

Each of the subsidiary patterns 104 is disposed so that the zero-order diffraction light from the main pattern 103 and the Fresnel diffraction light from the subsidiary pattern 104 may enhance each other when a ray of light having predetermined wavelength is projected, thereby clearly defining an edge of the pattern on an exposed surface and ensuring pattern transfer with high accuracy.

The image which is obtained when the phase-shifting mask 100 is imaged by the image pickup device 90 using an ordinary light source as shown in FIG. 10 can be seen like an image 106 in FIG. 12(a), and obviously differs in shape from a pattern 108 of a circuit pattern 107 shown in FIG. 12(b) which is initially designed.

Hence, it is impossible to detect any defect of the phase-shifting mask 100 by checking both pattern images.

SUMMARY OF THE INVENTION

The present invention is directed to a method of inspecting a phase-shifting mask used in an exposure step of a process of manufacturing a semiconductor device.

According to the first aspect of the present invention, the method of inspecting a phase-shifting mask comprises the steps of: (a) producing first pattern data as a function of a given circuit pattern; (b) converting the first pattern data into second pattern data used for manufacturing a phase-shifting mask; (c) manufacturing the phase-shifting mask as a function of the second pattern data; (d) detecting a pattern of the phase-shifting mask on the same optical condition as that of the exposure step which makes use of a phase shift method to obtain image data; and (c) checking the image data with the first pattern data.

The mask inspecting method according to the first aspect of the present invention comprises the steps of producing the first pattern data as a function of a given circuit pattern and converting the first pattern data to the second pattern data, to thereby manufacture a phase-shifting mask. Since the pattern of the phase-shifting mask formed as a function of the second pattern data for the phase-shifting mask is detected on the same optical condition as that of the exposure step in the process of practical manufacturing a semiconductor device which makes use of the phase shift method, it is possible to obtain an optical image of the identical pattern with a pattern practically transferred onto a semiconductor substrate such as a wafer as image data, so that it may be easily checked with the first designed pattern data. Hence the inspection of the phase-shifting mask can be accomplished for sure.

Preferably, the method of inspecting mask further comprises the steps of: imaging the pattern of the phase-shifting mask by an imaging means having no effect of the phase shift method to obtain image data; and checking the image data with the second pattern data.

In the above mask inspecting method according to the first aspect of the present invention, since the pattern of the phase-shifting mask is imaged by an imaging means having no effect of the phase shift method to obtain image data just like the mask pattern and then the image data is checked with the second pattern data, whereby it can be checked whether or not the phase-shifting mask is manufactured accurately in accordance with the second pattern data.

The present invention is also directed to a mask detector.

According to the present invention, the mask detector comprises: a light source for projecting single-wavelength light; a first optical system for introducing the light projected from the light source onto a mask surface of a phase-shifting mask; a second optical system for forming an optical image of the light which passes through the phase-shifting mask; and an imaging means for imaging the optical image of the phase-shifting mask to obtain image data; and wherein the mask detector is set to satisfy the following relations, $$\lambda 1 = \lambda$$

$$\sigma 1 = \sigma$$

$$m1 \cdot A1 = m \cdot A$$

where A1 and m1 represent a numerical aperture and a magnification of the mask detector, $\lambda 1$ and $\sigma 1$ represent a wavelength and a coherence of the light projected from the light source respectively, while A and m represent a numerical aperture and a magnification of an exposure device practically used in a process of manufacturing a semiconductor device, $\lambda$ and $\sigma$ represent a wavelength and coherence of used light therein.

The mask detector used for the mask inspecting method according to the first aspect of the present invention works on the same optical condition as that of the exposure device in the process of practical manufacturing a semiconductor device which makes use of the phase shift method, i.e., it is a light transmissive detector for imaging the light passing the pattern of the photomask. Since the wavelength, coherence and resolving power of used light therein are set to be same as those of the exposure device, the image data of the optical image thus obtained is identical with that of a pattern which is practically transferred onto a semiconductor device in use of the phase-shifting mask. Hence the above mask detector can carry out the mask inspecting method according to the first aspect of the present invention.

In the second aspect of the present invention, a method of inspecting a phase-shifting mask comprises the steps of: (a) producing first pattern data as a function of a given circuit pattern; (b) converting the first pattern data into second pattern data used for manufacturing a phase-shifting mask; (c) manufacturing the phase-shifting mask as a function of the second pattern data; (d) transferring the phase-shifting mask on the same optical condition as that of the exposure step which makes use of a phase shift method to obtain a mask for inspection; (c) imaging a pattern of the mask for inspection to obtain image data; and (f) checking the image data with the first pattern data.

In the mask inspecting method according to the second aspect of the present invention, since the phase-shifting mask which is formed as a function of the second pattern data for the phase-shifting mask is transferred onto another masking material on the same optical condition as that of the exposure step in the process of practical manufacturing a semiconductor device to manufacture a photomask for inspection having an identical pattern with the pattern practically formed on a wafer, then the photomask is imaged to obtain image data, so that it may be easily checked with the first pattern data initially produced. Hence it is possible to inspect the defects of the phase-shifting mask for sure.

Preferably, the method of inspecting mask further comprises the steps of: imaging the pattern of the phase-shifting mask by an imaging means having no effect of the phase shift method to obtain image data; and checking the image data with the second pattern data.

In the above mask inspecting method according to the second aspect of the present invention, since the pattern of the phase-shifting mask is imaged by an imaging means having no effect of the phase shift method to obtain image data just like the mask pattern and then the image data is checked with the second pattern data, whereby it can be checked whether or not the phase-shifting mask is manufactured accurately in accordance with the second pattern data.

Accordingly, an object of the present invention is to provide a mask inspecting method which is capable of detecting defects of a phase-shifting mask for sure and a mask detector used therein so as to solve the above-mentioned problems in the conventional mask inspecting method.

These and other objects, features, aspects and advantages of the present invention will become more apparent from the following detailed description of the present invention when taken in conjunction with the accompanying drawings.

DESCRIPTION OF THE PREFERRED EMBODIMENTS

Now, preferred embodiments in accordance with the present invention will be described while referring to the figures, as a matter of course, however, that is not intended to limit the technical scope of the present invention.

Figure 1:
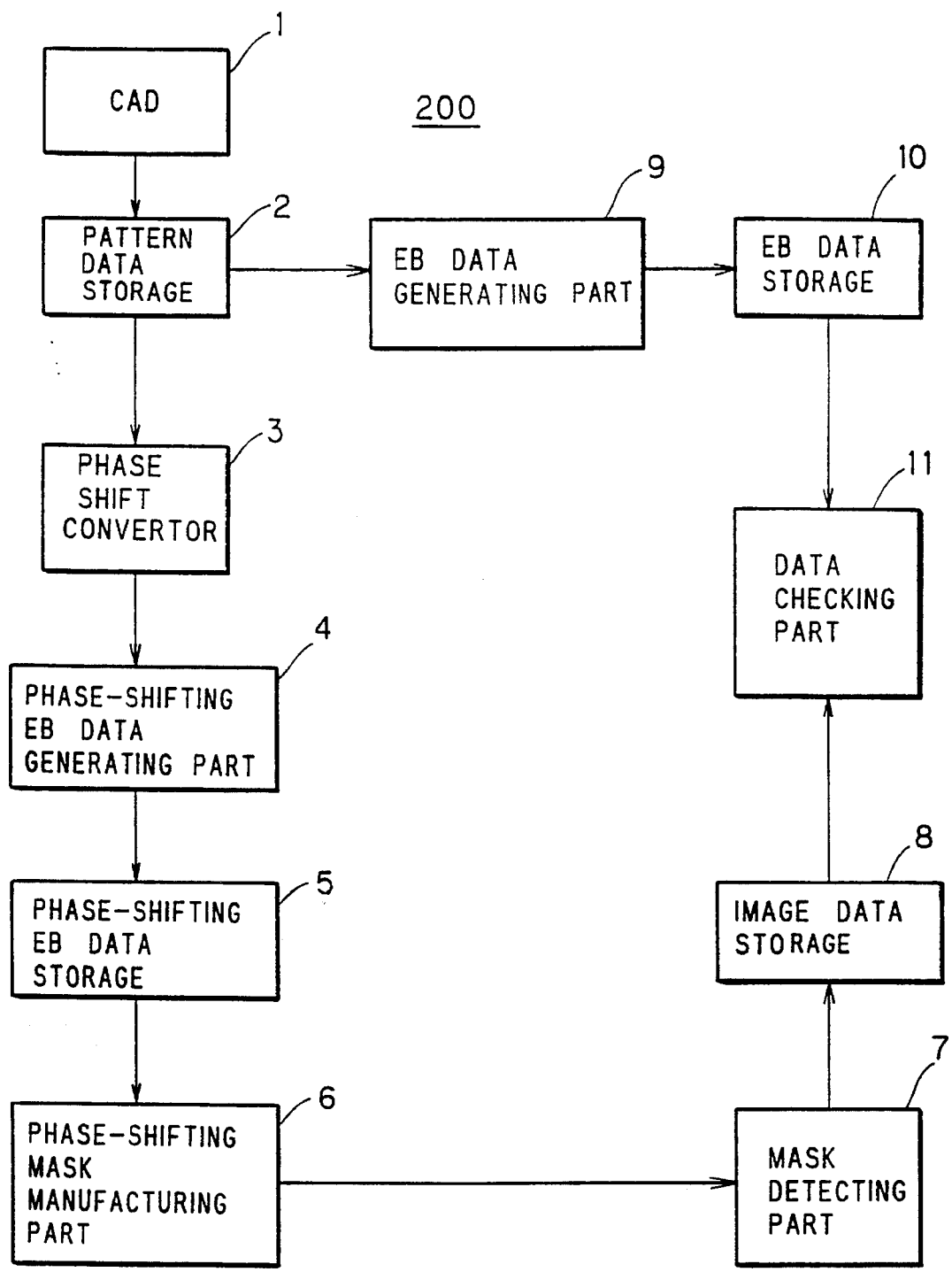
FIG. 1 is a block diagram showing a system structure for carrying out a mask inspecting method in accordance with a first preferred embodiment of the present invention.

FIG. 1 is a block diagram showing a mask inspecting system in accordance with a first preferred embodiment of the present invention.

Figure 12A:
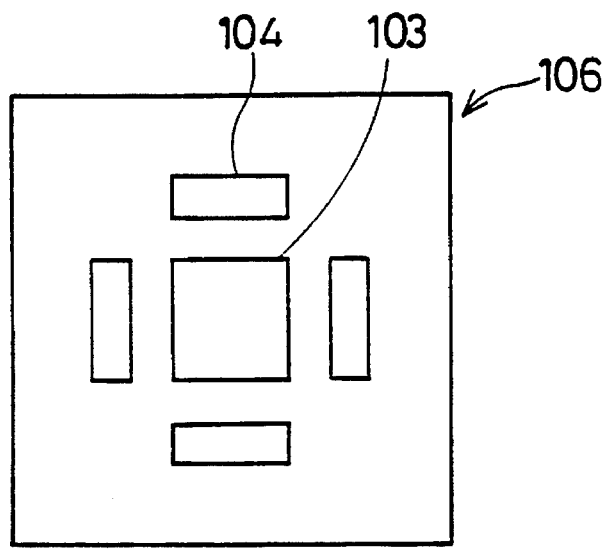
FIG. 12(a) illustrates a shape of a pattern of the phase-shifting mask.
Figure 12B:
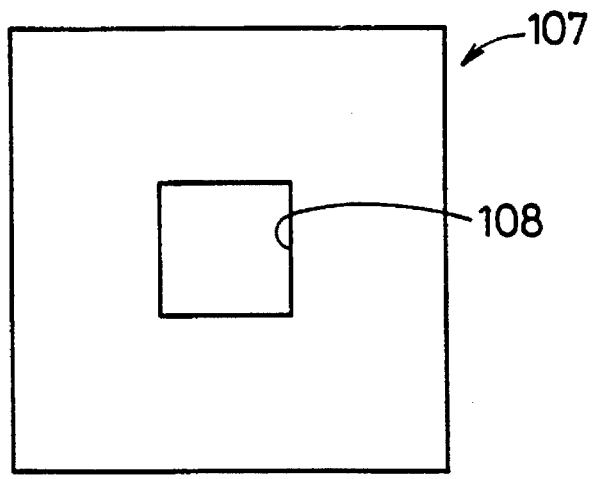
FIG. 12(b) illustrates that of a circuit pattern.

A circuit pattern 107, as shown in FIG. 12(b), designed by a circuit designer with CAD 1 is stored as first pattern data in a pattern data storage 2 such as a magnetic disk and the like.

The first pattern data are converted into second pattern data (including pattern data of a light-shielding film and a phase shifter) for a phase-shifting mask in a phase shift convertor 3 to form a main pattern 103 and subsidiary patterns 104, for example, as shown in FIG. 12(a).

In the phase shift convertor 3, the main pattern 103 and the subsidiary patterns 104 are defined in shape, size and the positional relation therebetween so that a phase shift method may be effective for a light source having a predetermined wavelength in an exposure step of a process of manufacturing a semiconductor device, i.e., the Fresnel diffraction light from the subsidiary patterns 104 and the zero-order diffraction light from the main pattern 103 may enhance each other to define an edge of a circuit pattern 108.

The second pattern data for the phase-shifting mask which are generated in the phase shift convertor 3 are converted into EB data for the phase-shifting mask which are employed so as to operate an electron beam lithography device (referred to as "phase-shifting EB data" hereinafter) in a phase-shifting EB data generating part 4, then the phase-shifting EB data are stored in a phase-shifting EB data storage 5.

The phase-shifting EB data provide an on/off signal and position data of an electron beam of the above-mentioned electron beam lithography device so as to operate it.

Figure 13:
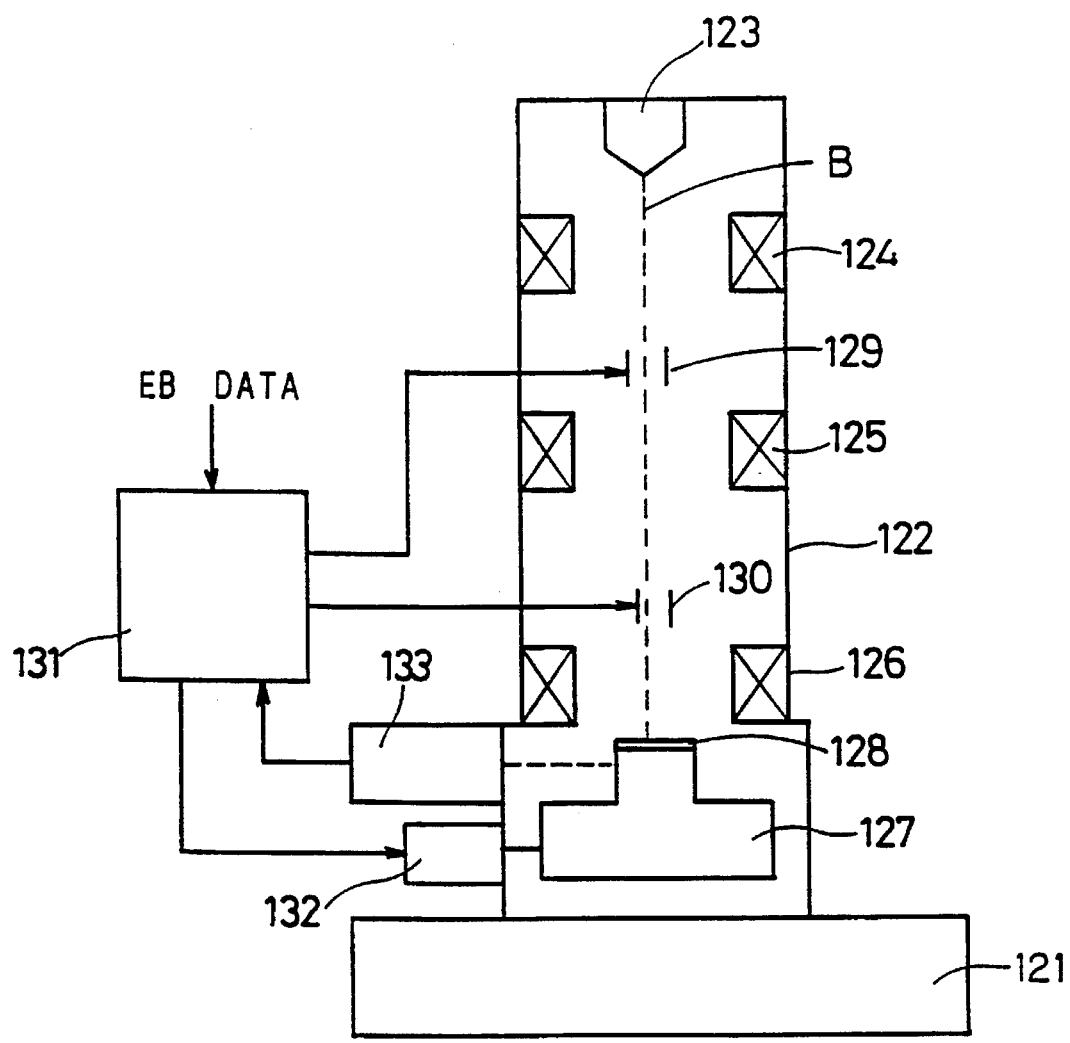
FIG. 13 illustrates a structure of an electron beam lithography device.

FIG. 13 illustrates a structure of the electron beam lithography device 120.

A casing 122 placed on a vibration proof rack 121 is provided inside with an electron gun 123. An electron beam B which is shot from the electron gun 123 is converged step by step through ring-shaped electromagnetic lenses 124, 125 and 126 and then projected onto a resist surface of a masking material 128 placed on a table 127.

A blanking electrode 129 and a deflecting electrode 130 are located on the way of an optical path of the electron beam B, a control part 131 controls each voltage to be applied thereto.

The table 127 is movable in XY direction by a driving means 132, and the moving distance is precisely measured by a laser interferometer 133.

In the electron beam lithography device 120 thus constructed, when the phase-shifting EB data described above is inputted to the control part 131, the control part 131 controls voltage to be transmitted to the deflecting electrode 130 and the blanking electrode 129 as a function of the on/off signal and position signal of the EB data so that the defecting electrode 130 may deflect the electron beam B by very short distance to thereby make a drawing on the resist surface of the masking material 128, and further applies voltage to the blanking electrode 129, deflecting the electron beam B extensively so as to hinder it from being projected onto the masking material.

Figure 11A:
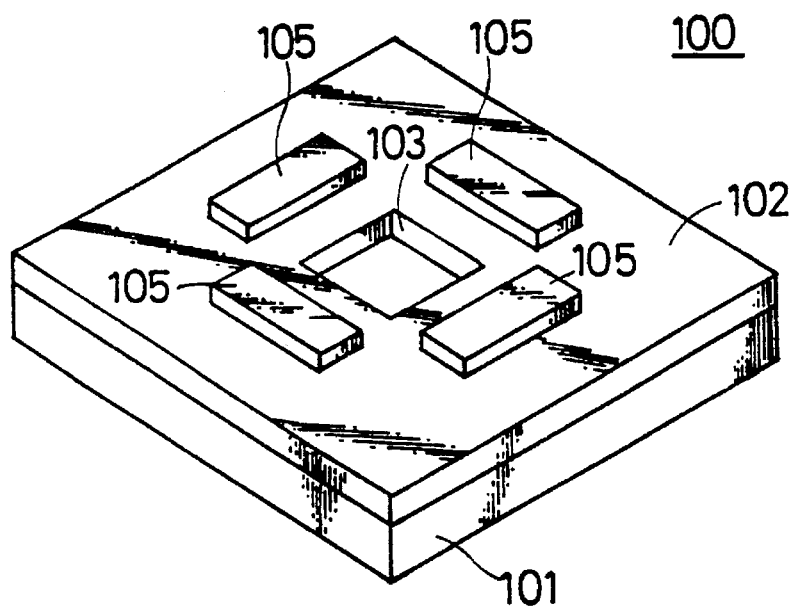
FIG. 11(a) illustrates a whole phase-shifting mask.

Since there is a limit of the deflection distance caused by the deflecting electrode 130, the table can be properly moved by the driving means 132 and the moving distance of the table is fed back to the control part 131 by the laser interferometer 133, to be precisely controlled.

in a phase-shifting mask manufacturing part 6, a phase-shifting mask 100 of FIG. 11 is manufactured in use of the above electron beam. The process goes as follows:

(1) A metal thin film such as chromium is formed on a glass substrate 101 by sputtering and the like to manufacture a mask blank (masking material).

(2) An upper surface of the metal thin film of the mask blank is further coated with a resist (photoresist or EB resist exclusively used for electron beam exposure).

(3) The electron beam lithography device projects the electron beam to a predetermined portion of the mask blank as a function of the EB data to draw shapes of the main pattern 103 and the subsidiary pattern 104 on the resist surface to be exposed.

(4) The exposed resist is developed, and a portion of the metal thin film with the resist off is removed in an etching step to form the main pattern 103 and subsidiary pattern 104.

(5) The remaining resist is removed.

(6) The subsidiary pattern 104 is filled up with a phase shifter 105.

Next, in a mask detecting part 7, the phase-shifting mask 100 thus manufactured is imaged to obtain image data related to the pattern by a mask detector which is set for a predetermined optical condition.

Figure 2:
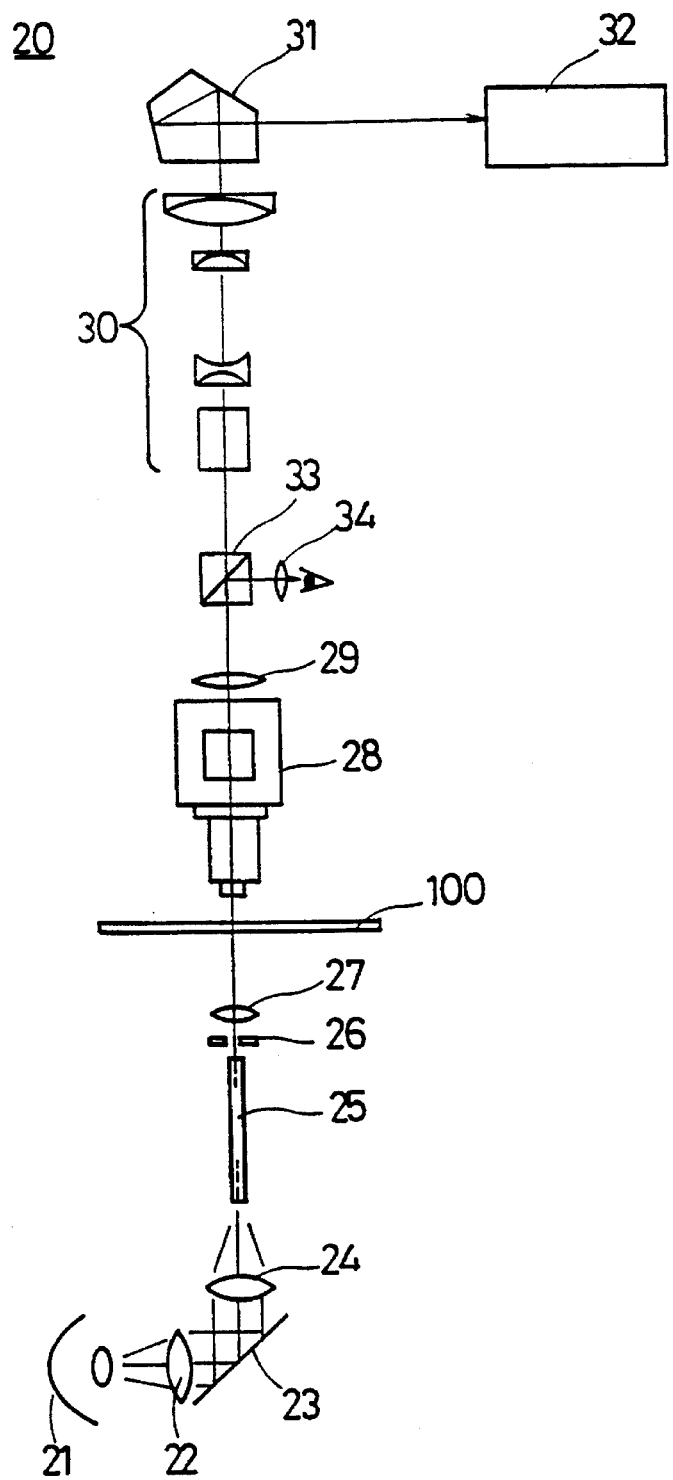
FIG. 2 illustrates a structure of a mask detector.

FIG. 2 illustrates a structure of the mask detector 20.

Light from a light source 21 is introduced by the first optical system composed of a lens 22, a mirror 23, a condenser lens 24, a relay lens 25, an aperture 26 and another condenser lens 27 to be perpendicularly projected onto the mask surface of the phase-shifting mask 100.

The light source part 21 employs a light source emitting light of a single wavelength $\lambda 1$, such as a Hg lamp.

The aperture 26 serves to stop down a luminous flux so as to adjust the coherence to be $\sigma 1$.

Light passing through the main pattern and the subsidiary pattern of the phase-shifting mask 100 further goes through the second optical system composed of an object lens 28, a condenser lens 29, a group of relay lenses 30 and a polygon prism 31 to form an image to be detected by a television camera 32. The object lens 28 serves to adjust a magnification m1 and a numerical aperture A1. For the television camera 32, such is employed as well catches light with wavelength $\lambda 1$.

Now, assuming that a wafer exposure device practically used in the exposure step of the process of manufacturing a semiconductor device has a numerical aperture A, a magnification m, a wavelength $\lambda$ of the light source and a coherence $\sigma$, a numerical aperture A1, a magnification m1, a wavelength $\lambda 1$ of the light source and a coherence $\sigma 1$ of the above-mentioned mask detecting device are set to satisfy the following relations;

$$\lambda 1 = \lambda$$

$$\sigma 1 = \sigma$$

$$m1 \cdot A1 = m \cdot A$$

Based on the above relations, respective minimum resolving powers R1 and R of the mask detector 20 and the exposure device are expressed as follows;

$$R1 = \lambda 1/A1 = \lambda/(m \times A/m1)$$
$$= \lambda m1/mA = (m1/m) \times R$$

Since a magnification m of the wafer exposure device is usually set for one fifth, when a magnification m1 of the mask detector 20 is supposed to be 100, the relation of both minimum resolving powers goes R1=500·R. Therefore, the optical characteristics of the mask detector 20 in use of a pattern magnified 500 times is completely same as that of the wafer exposure device.

Further, since a wavelength of the light source and a coherence of the mask detector 20 are same in value as those of the wafer exposure device, the characteristics of the phase shift method which is generated in the wafer exposure device can be developed also in the pattern magnified 500 times.

Hence, it is possible to obtain the image data of the pattern magnified 500 times, as compared with the pattern which is formed on a wafer by the wafer exposure device, in consideration of the effect of improving the resolving power by the phase shift method. The magnified pattern is useful for inspecting the phase-shifting mask in details and for sure.

Furthermore, since $\lambda$ is usually set for 365 nm or 248 nm and $\sigma$ for about 0.3 to 0.6 in the wafer exposure device, it is desirable that $\lambda 1$, $\sigma 1$, m1 and A1 of the mask detector 20 are each set to be variable in value so as to deal with various kind of wafer exposure devices.

When m1 is set for 1, an optical image for being inspected is obtained corresponding to the first pattern data in size, so that it can be checked without adjustment of magnification in the data checking part 11 described below.

Further, there lies a half mirror 33 between the condenser lens 29 and a group of relay lenses 30 in the mask detector 20, whereby an image can be confirmed by visual observation through an eyepiece 34.

In addition, a two-dimensional photo array sensor is available instead of the television camera 32, and both may be used together.

Further provision of a binary circuit converting the image data from the television camera 32 into binary with a definite threshold value may make it easier to check the data in the data checking part 11.

The image data corresponding to the pattern of FIG. 12(b) is obtained by the mask detector 20 using the phase-shifting function, to be stored in a EB data storage 10.

In an EB data generating part 9, the first pattern data (which correspond to the pattern of FIG. 12(b)) are read out from the pattern data storage 2, being converted into EB data for an electron beam device, to be stored in an EB data storage 10.

In the data checking part 11, the EB data are read out from the EB data storage 10 while the image data of the phase-shifting mask detected by the mask detector 20 are read out from the image data storage 8, then both data appear on a CRT with one over another.

As necessity required, an operator adjusts the magnification of either data so that both data may overlap each other.

Then, the step of checking both data is carried out. In more concrete terms, after image data of the pattern are converted into binary data with a definite threshold value, the binary image data and the EB data are checked mutually in value of "0" and "1" while simultaneously scanning in the same direction.

Furthermore, in the mask inspecting system 200, the EB data generating part 9 and the EB data storage 10 are not always necessary. It is only needed, in short, that the first pattern data stored in the pattern data storage 2 are converted into signals so as to be displayed on the CRT and the like in the data checking part 11, e.g., may be directly converted into binary image data.

In the data checking part 11, when the first pattern data and the image data from the image data storage 8 are completely matched, it is found that the pattern of the phase-shifting mask has no defect, i.e., passes the inspection.

In the case that some defects are found in the phase-shifting mask, two main causes to be considered are as follows.

First, them arise some errors in the step of data conversion executed in the phase shift convertor 3 of the mask inspecting system 200. Second, some defects exist in the mask manufacturing step in the phase-shifting mask manufacturing part 6.

Figure 3:
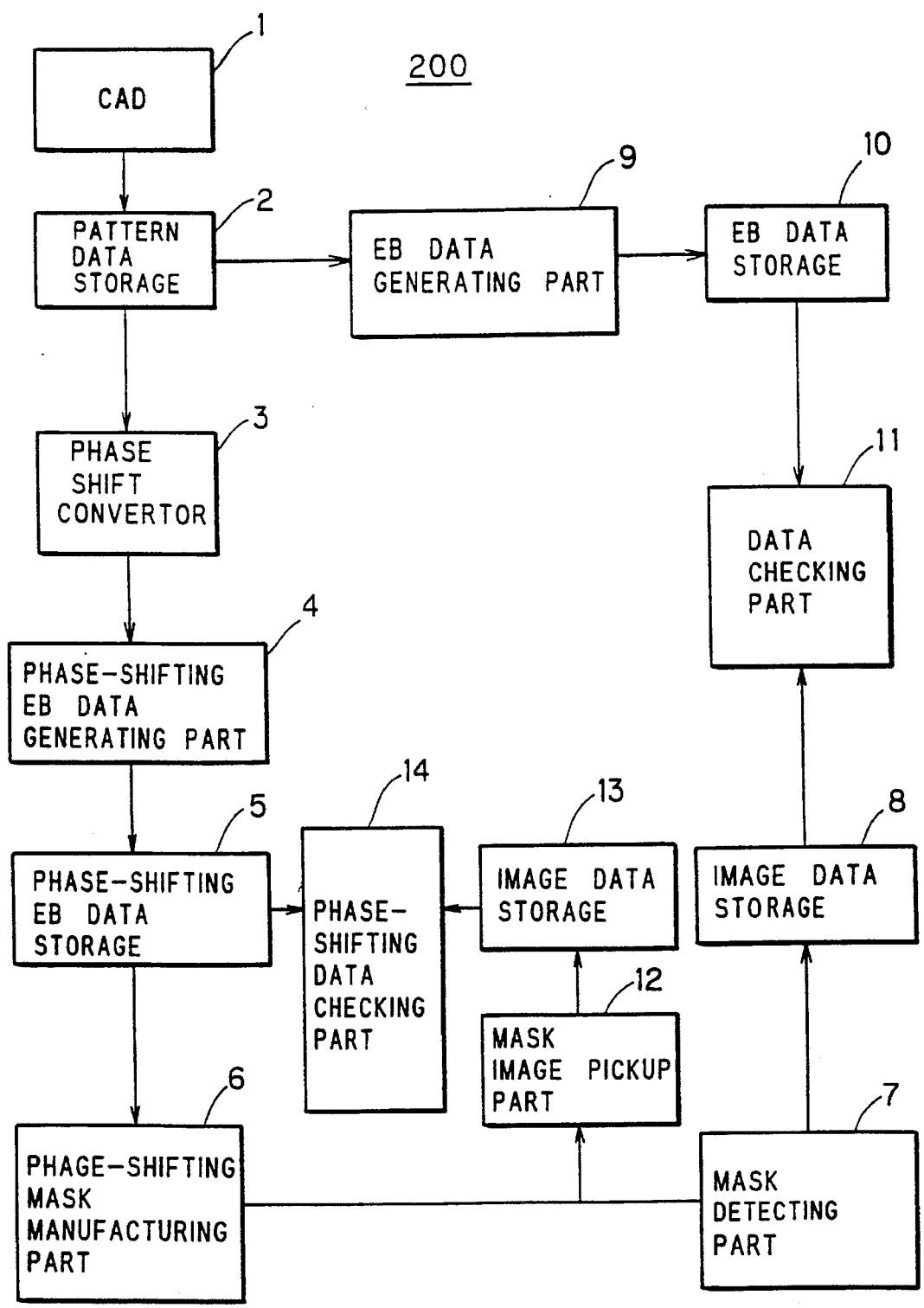
FIG. 3 is a block diagram showing a variation of the mask inspecting system of FIG. 1.

In such a case, the true cause may be determined by the further provision of a phase-shifting data checking part 14 in the mask inspecting system 200, as shown in FIG. 3.

Figure 10:
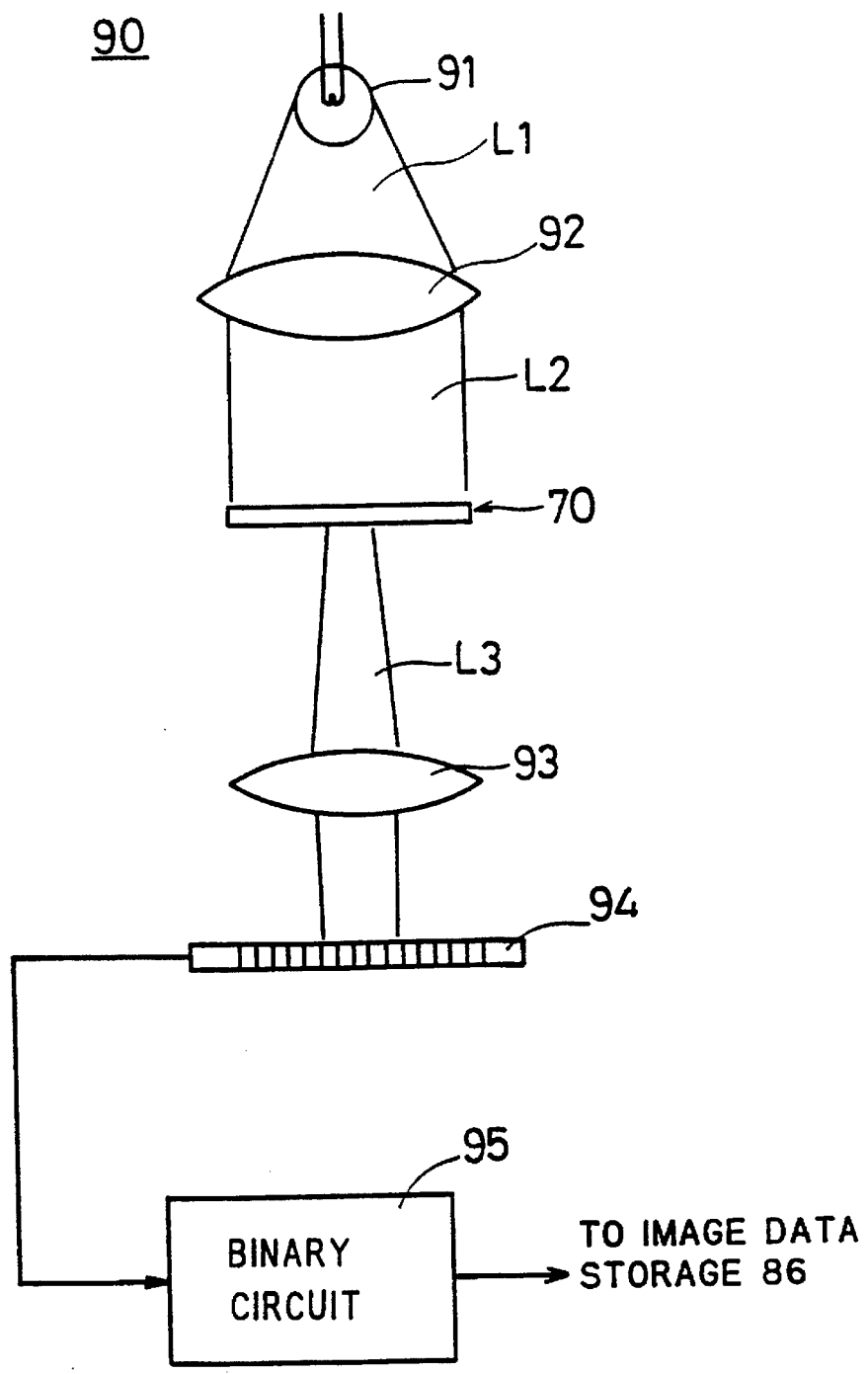
FIG. 10 illustrates an exemplary image pickup device in the conventional inspecting system for a photomask.

That is, the phase-shifting mask manufactured in the phase-shifting mask manufacturing part 6 is imaged by an image pickup device 90 using all ordinal light source with no effect of phase shift method, for example, as shown in FIG. 10, in the mask image pickup part 12, then a mask pattern thus obtained is stored as image data without being converted in an image data storage 13.

In the phase-shifting data checking part 14, the image data from the image data storage 13 and the EB data for the phase-shifting mask from the phase-shifting EB data storage 5 are compared.

Data checking is carried out in the like manlier as in the data checking part 11. If both data are matched, the phase-shifting mask is manufactured precisely according to the pattern data for the phase-shifting mask, therefore it is found that some errors exist in a program for data conversion in the phase-shifting convertor 3.

Thus, the double inspection is carried out for the phase-shifting mask, thereby ensuring more reliable effect of the mask inspection.

Figure 4:
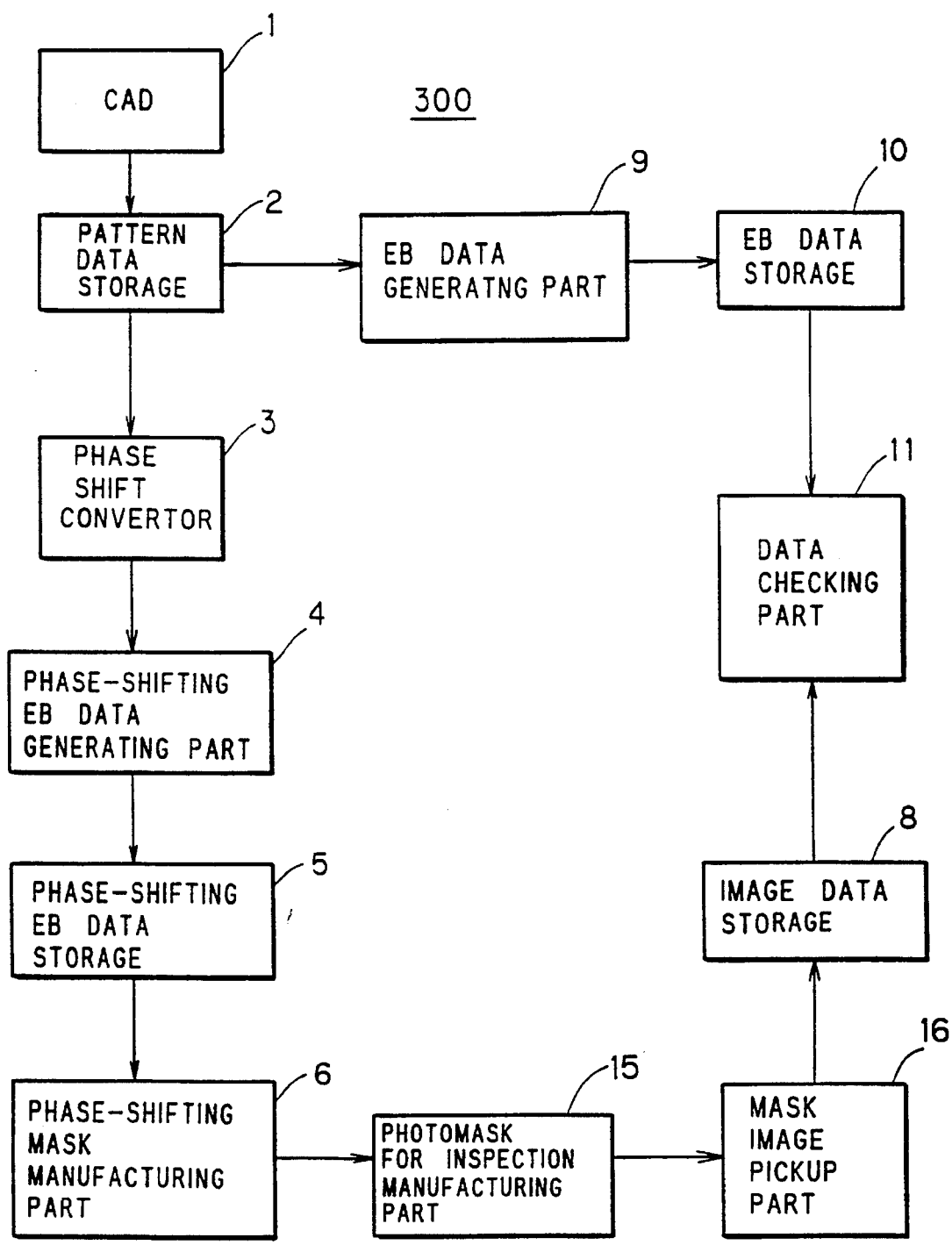
FIG. 4 is a block diagram showing a system structure for carrying out a mask inspecting method in accordance with a second preferred embodiment of the present invention.

Next, another mask inspecting method according to a second preferred embodiment of the present invention will be described while referring to a block diagram of a mask inspecting system shown in FIG. 4.

In the figure, the block with the same number has the same content as FIG. 1, so the description associated therewith will be omitted.

The mask inspecting system described herein differs from that of the first preferred embodiment in that the phase-shifting mask which is manufactured in the phase-shifting mask manufacturing part 6 is not directly detected by the mask detector 20, but transferred onto another masking material on the same condition as that of an exposure device used in the process of manufacturing a semiconductor device so as to form a photomask for inspection.

In other words, a photomask for inspection manufacturing part 15 includes a mask exposure device which exposes the masking material on the same condition as that of a wafer exposure device used in a practical wafer exposure step.

Figure 5:
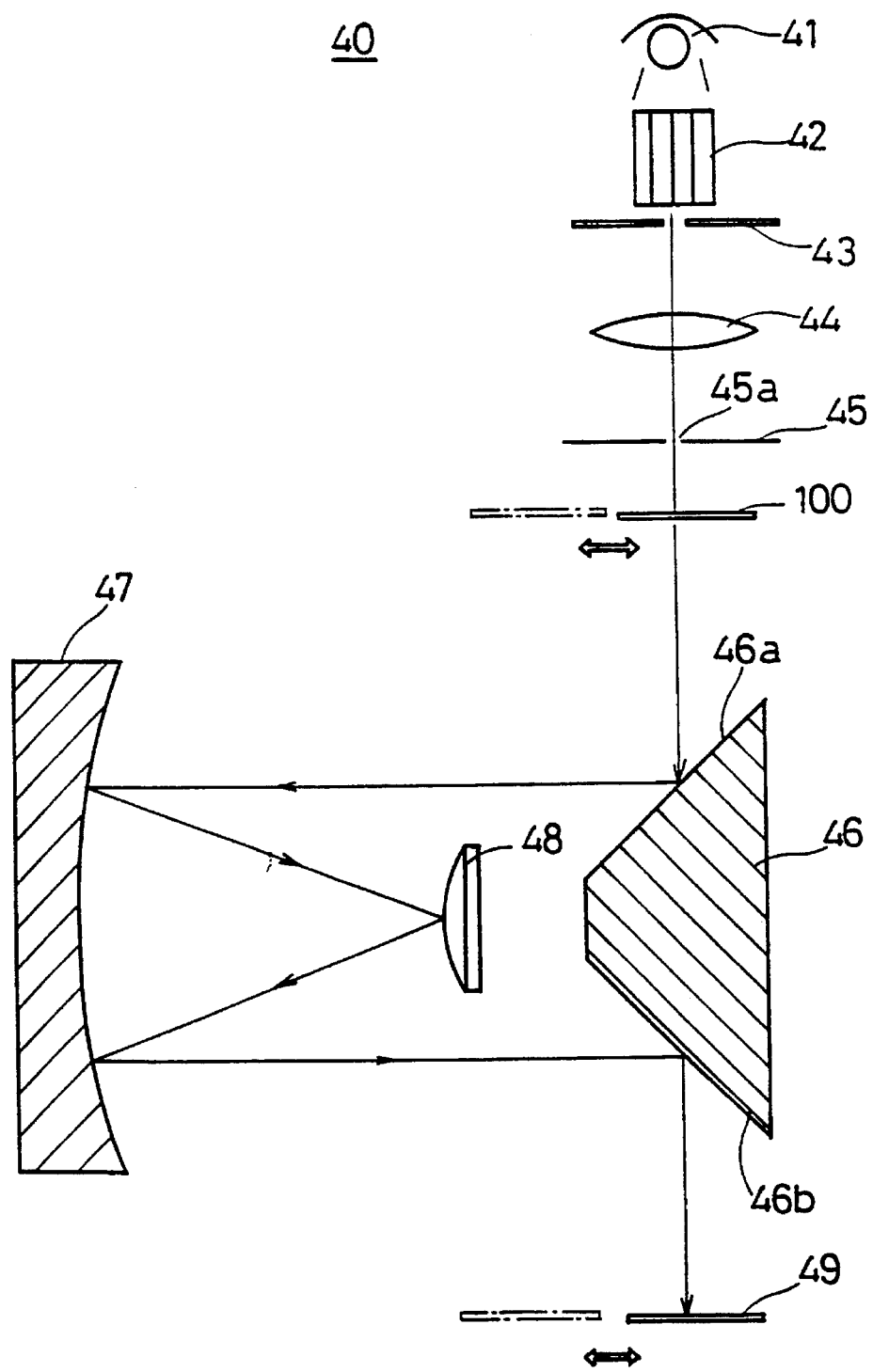
FIG. 5 illustrates a structure of a mask exposure device for manufacturing a photomask to be inspected.
Figure 6:
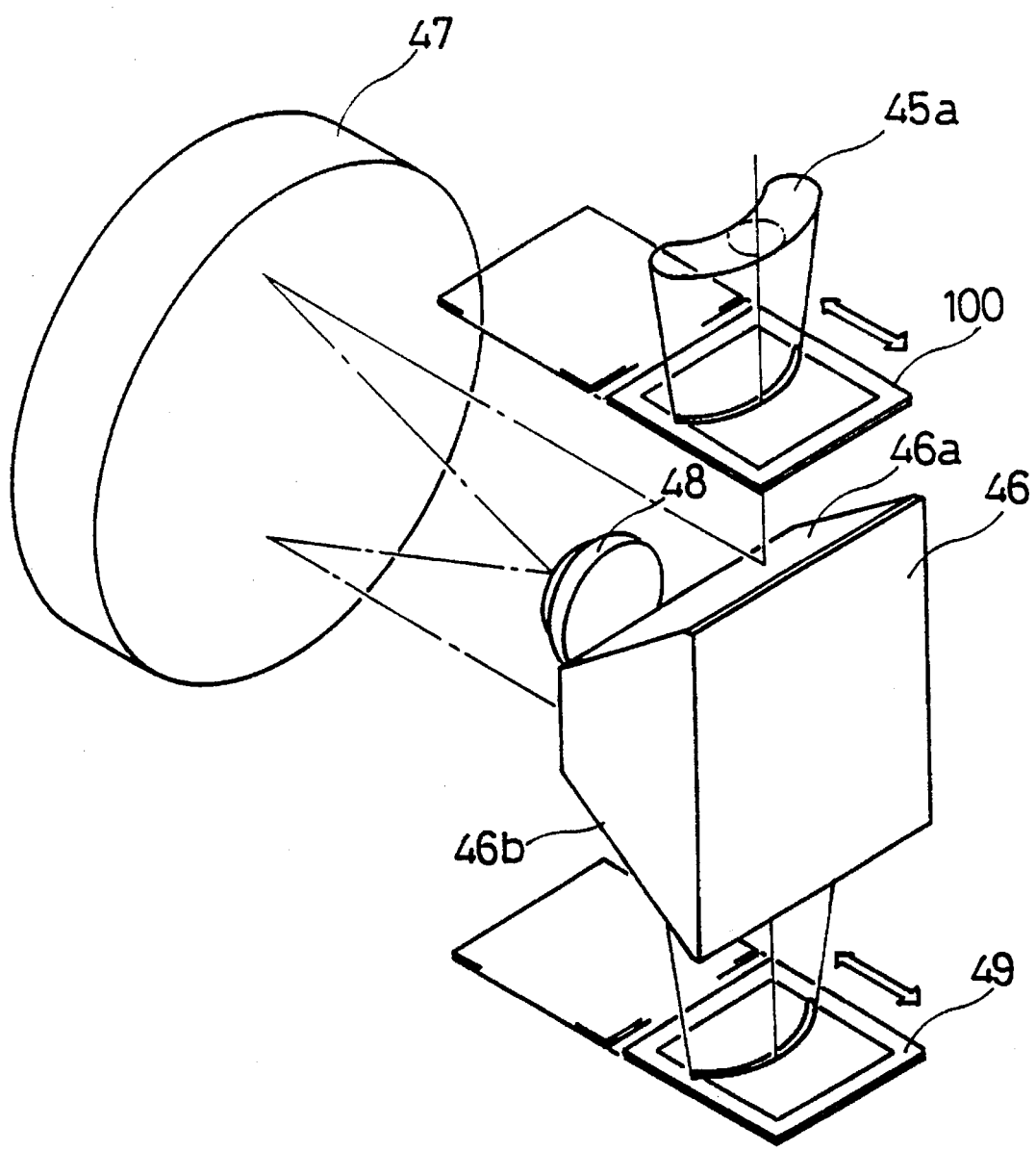
FIG. 6 is a partial perspective view of the mask exposure device of FIG. 5.

FIG. 5 is a view showing a structure of a mask exposure device 40 while FIG. 6 is a perspective view of a part below a slit 45 of the mask exposure device 40 from diagonally upper direction.

Light of wavelength λ2 emitted from a light source 41 of single wavelength is converted into parallel beam by a fly-eye lens 42 while the coherence thereof being adjusted to be σ2 by an aperture 43, thereafter is converged by a condenser lens 44.

As shown in FIG. 6, the slit 45 includes an arc-shaped slit 45a determining a form of luminous flux to be most suitable for exposure.

The light passing through the arc-shaped slit 45a is irradiated on the mask surface of the phase-shifting mask 100. Further, the light through the pattern thereof is turned in direction by an upper surface 46a of a trapezoidal mirror 46 to travel to an upper portion of a concave mirror 47, next to a convex mirror 48, to a lower portion of the concave mirror 47 and to a lower surface 46b of the trapezoidal mirror 46, thus being projected onto a resist surface of a masking material 49.

The condenser lens 44 in the mask exposure device 40 has a numerical aperture A2 and an optical path which is set so that a magnification m2 in image is "1".

The phase-shifting mask 100 and the masking material 49 are synchronously moved by a driving means not shown, so that the patterns of phase-shifting mask 100 may be exposed on the masking material 49 at a ratio of 1 to 1.

Now, assuming that an exposure device practically used in the exposure step of the process of manufacturing a semiconductor device has a numerical aperture A, a magnification m, a wavelength λ of the used light and a coherence σ, an aperture A2, a magnification m2, a wavelength λ2 of the light source and a coherence σ2 of the above mask exposure device 40 are set to satisfy the following relations;

$$\lambda 2 = \lambda$$

$$\sigma 1 = \sigma$$

$$m2 \cdot A2 = m \cdot A$$

Based on the above relations, respective minimum resolving powers R2 and R of the mask exposure device 40 and the wafer exposure device used in the exposure step of the process of manufacturing a semiconductor device are expressed as follows;

$$\begin{aligned} R2 &= \lambda 2/A2 = \lambda/(m \times A/m2) \\ &= \lambda m2/mA = (m2/m) \times R \end{aligned}$$

Since a magnification m of the wafer exposure device is usually set for one fifth, when a magnification m2 of the mask exposure device 40 is supposed to be 1, the relation of both minimum resolving powers goes R2=5·R. Therefore, the optical characteristics of the mask exposure device 40 in use of a pattern magnified 5 times is completely same as that of the wafer exposure device.

Further, since a wavelength of the used light and a coherence of the mask exposure device 40 are same in value as those of the exposure device, the characteristics of the phase shift method which is generated in the wafer exposure device can be developed also in the pattern magnified 5 times.

Hence, it is possible to expose the masking material 49 in the pattern 5 times as large as that of the exposure device in consideration of the effect of improving the resolving power by the phase shift method, so that defects may be easily found.

Furthermore, since λ is usually set for 365 nm or 248 nm and σ for about 0.3 to 0.6 in the wafer exposure device, it is desirable that λ2, σm2, m2 and A2 of the mask exposure device 40 are each set to be variable in value so as to deal with various kind of wafer exposure devices.

The masking material exposed by the mask exposure device 40 is developed, then a portion of a light shielding film with the photoresist off is etched, and the remaining photoresist is removed, to thereby form a photo mask for being inspected which has patterns corresponding to those of FIG. 12(b).

In a mask image pickup part 16, a mask pattern of the photo mask for inspection is formed by the image pickup device 90 shown in FIG. 10, to be stored as image data without being converted in a image data storage 8.

In this instance, the photo mask for inspection has only an ordinal pattern corresponding to a main pattern and no subsidiary patterns or phase shifters, therefore it is not needed to particularly limit an optical condition of the image pickup device.

In data checking part 11, the EB data obtained through the conversion of the first pattern data are read out from the EB data storage 10 while image data of a mask pattern of a photo mask for inspection are read out from the image data storage 8, then both data are checked, thus inspecting defects of the phase-shifting mask.

The mask inspecting method described above according to the second preferred embodiment has an advantage of the lower cost for equipment, as compared with the mask inspecting method of the first preferred embodiment.

In other words, it is only necessary to improve the mask exposure device 40 shown in FIG. 5 so that a masking material may be disposed on a place for a wafer of an exposure device employed in conventional manufacturing process of a semiconductor device. In the mask image pickup part 16, the image pickup device for a conventional mask inspecting system can be also used, without necessity of preparing another mask detector 20 (as shown in FIG. 2) unlike the mask inspecting method of the first preferred embodiment, so that the cost for the system may be cut down.

Moreover, the mask inspecting system 300 may have a structure in which a mask pattern of a phase-shifting mask can be checked with the second pattern data.

Figure 7:
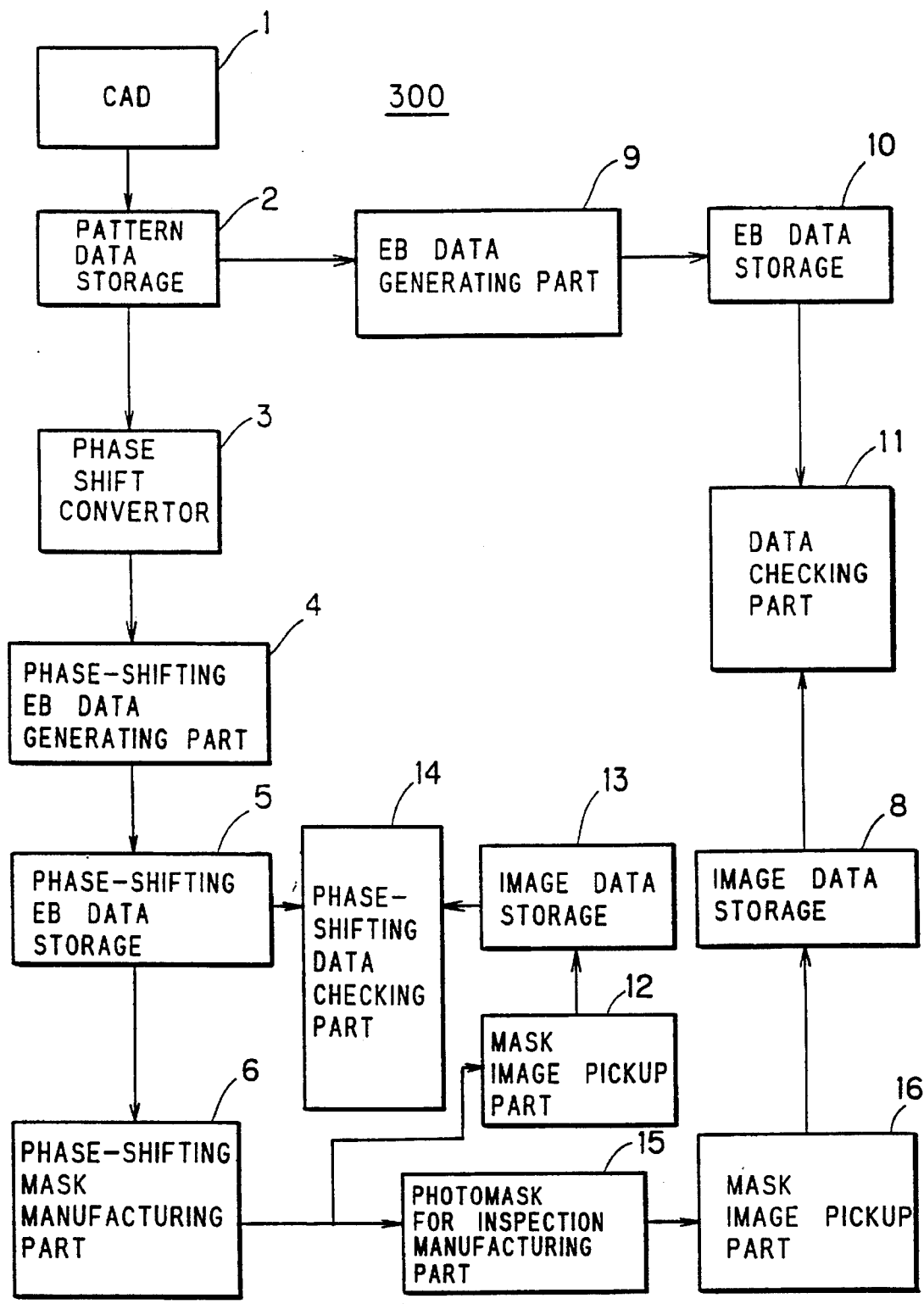
FIG. 7 is a block diagram showing a variation of the mask inspecting system of FIG. 4.
Figure 8:
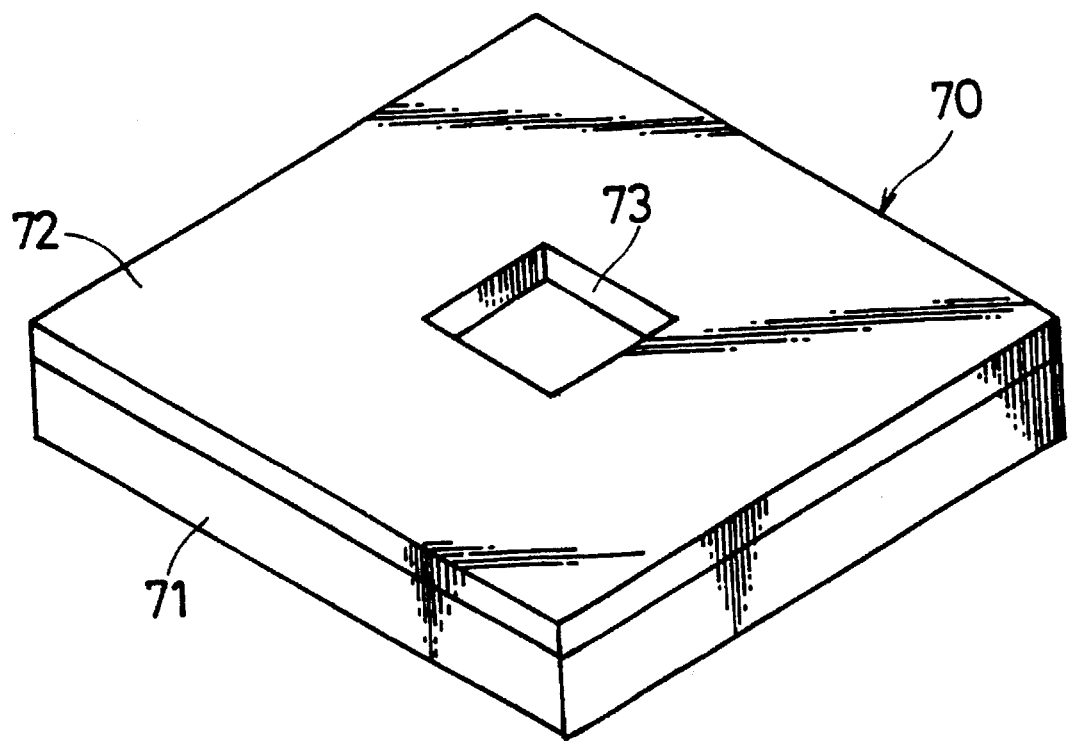
FIG. 8 is a perspective view of a conventional photomask.
Figure 9:
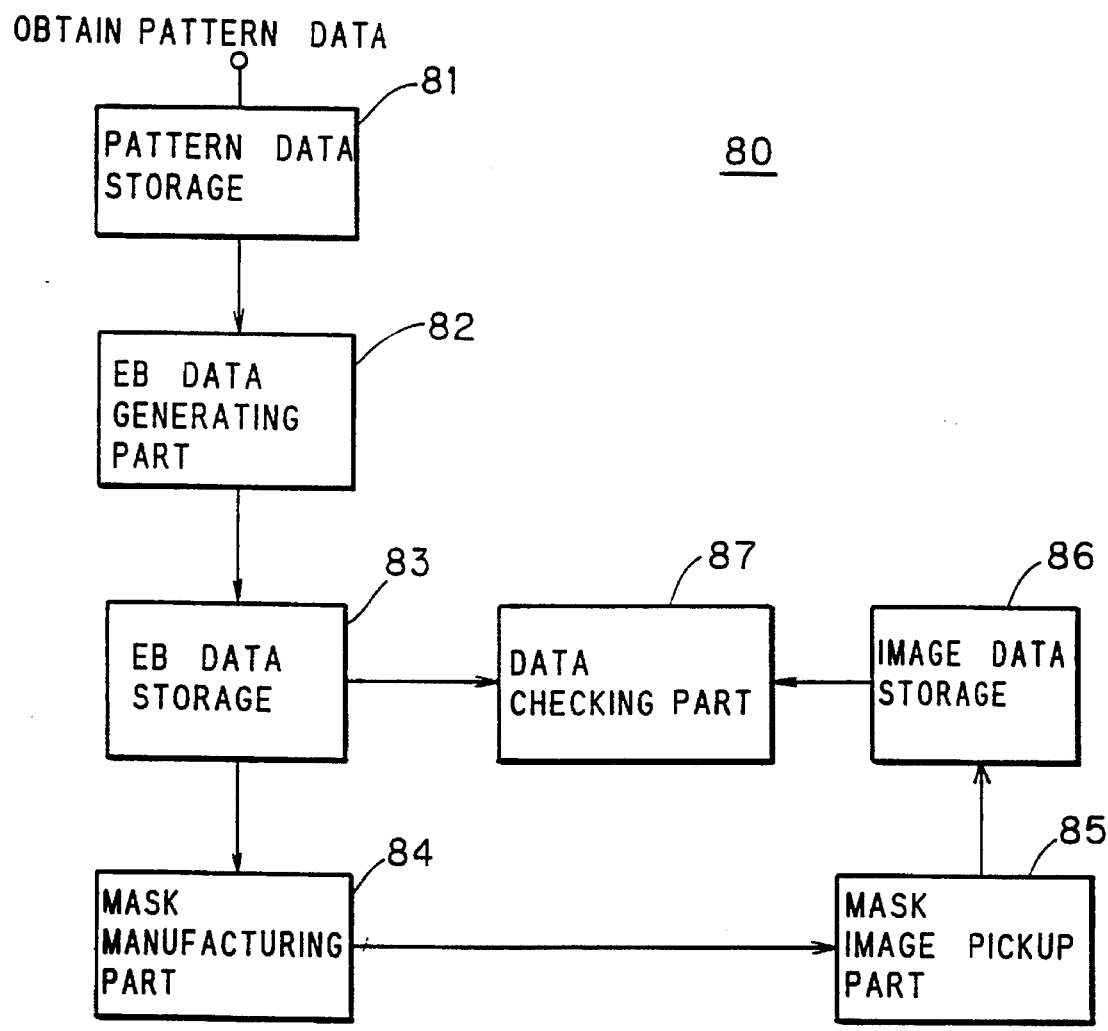
FIG. 9 is a block diagram showing a conventional inspecting system for a photomask.

FIG. 7 shows an example of the system structure.

In the mask image pickup part 12, the image pickup device 90 (shown in FIG. 10) using an ordinal light source without effect of the phase shift method forms an image of the phase-shifting mask which is manufactured in the phase-shifting mask manufacturing part 6, then the image is stored as image data (corresponding to the pattern of FIG. 12(a)) in an image data storage 13. In the phase-shifting data checking part 14, the image data and the EB data for the phase-shifting mask from the phase-shifting EB data storage 5 are checked.

Thus, it can be checked whether or not the phase-shifting mask is manufactured accurately in accordance with the pattern data for the phase-shifting mask.

The mask inspecting method according to the present preferred embodiment enables checking not only defects made in manufacturing a phase-shifting mask but also defects in converting the pattern data of the circuit pattern (the first pattern data) into the pattern data for the phase-shifting mask (the second pattern data), thereby ensuring double inspection for phase-shifting mask.

Figure 11B:
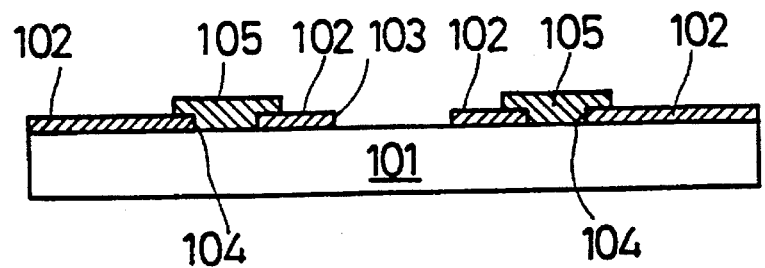
FIG. 11(b) illustrates a vertical section of the phase-shifting mask.
Figure 14:
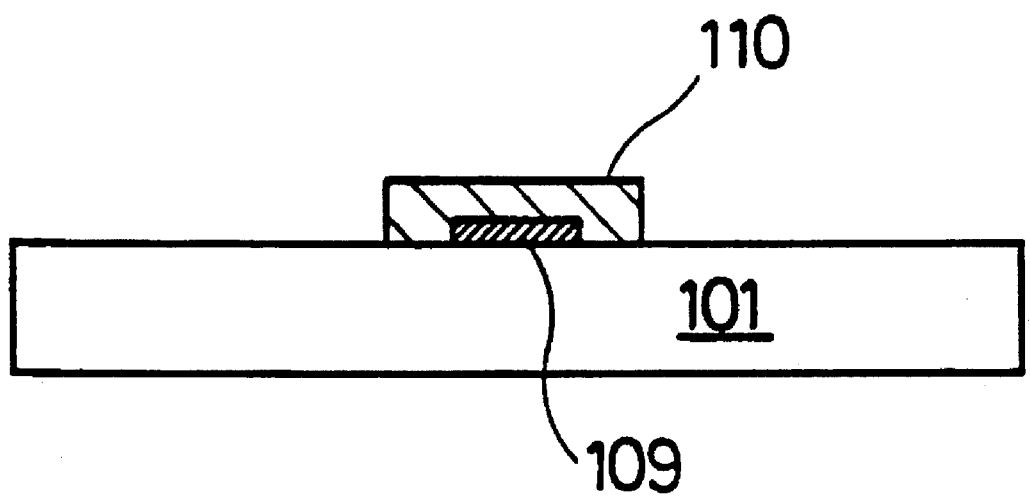
FIG. 14 illustrates an another example of the phase-shifting mask.

Furthermore, the shape of the phase-shifting mask to be inspected is not limited to that shown in FIG. 11(b). For example, the configuration may be an arrangement where a light shielding film 109 made of metal such as chromium is formed on a glass substrate 101, being covered with a phase shifter 110, as shown in FIG. 14.

While the invention has been shown and described in detail, the foregoing description is in all aspects illustrative and not restrictive. It is therefore understood that numerous modifications and variations can be devised without departing the scope of the invention.

I claim:

1. A method of inspecting a phase-shifting mask used in an exposure step of a process of manufacturing a semiconductor device, comprising the steps of:

(a) producing first pattern data as a function of a given circuit pattern;

(b) converting said first pattern data into second pattern data used for manufacturing a phase-shifting mask;

(c) manufacturing said phase-shifting mask as a function of said second pattern data;

(d) detecting a pattern of said phase-shifting mask using optical conditions related with those of said exposure step which makes use of a phase shift method to obtain image data; and (e) checking said image data with said first pattern data;

wherein said step of detecting a pattern of said phase-shifting mask is performed using a mask detector and comprises:

projecting single-wavelength light using a light source;

introducing said light from said light source onto a mask surface of said phase-shifting mask using a first optical system;

forming an optical image of said light which passes through said phase-shifting mask using a second optical system;

imaging said optical image of said phase-shifting mask to obtain image data using an imaging means; and setting said mask detector to satisfy the following relations, $$\lambda 1 = \lambda$$

$$\sigma 1 = \sigma$$

$$m1 \cdot A1 = m \cdot A$$

$$m1 > m$$

where A1 and m1 represent a numerical aperture and a magnification of said mask detector, $\lambda 1$ and $\sigma 1$ represent a wavelength and a coherence of said light projected from said light source respectively, while A and m represent a numerical aperture and a magnification of said exposure device used in a process of manufacturing a semiconductor device, $\lambda$ and $\sigma$ represent a wavelength and a coherence of light used therein;

said method further comprising inspecting with an enlarged pattern based on $$R1 = (m1/m) \cdot R;$$

where R1 and R represent minimum resolving powers of said mask detector and said exposure device used in a process of manufacturing a semiconductor device, respectively.

2. A method of inspecting a mask of claim 1, wherein said first pattern data are produced by using CAD.

3. A method of inspecting a mask of claim 1, wherein said method further comprises the steps of:

imaging said pattern of said phase-shifting mask by an imaging means which does not produce a phase shift to obtain image data; and checking said image data with said second pattern data.

4. A mask detector having a minimum resolving power R1, comprising:

a light source for projecting single-wavelength light;

a first optical system for introducing said light projected from said light source onto a mask surface of a phase-shifting mask;

a second optical system for forming an optical image of said light which passes through said phase-shifting mask; and an imaging means for imaging said optical image of said phase-shifting mask to obtain image data; and wherein said mask detector is set to satisfy the following relations, $$\lambda 1 = \lambda$$

$$\sigma 1 = \sigma$$

$$m1 \cdot A1 = m \cdot A$$

$$m1 > m$$

where A1 and m1 represent a numerical aperture and a magnification of said mask detector, $\lambda 1$ and $\delta 1$ represent a wavelength and a coherence of said light projected from said light source respectively, while A and m represent a numerical aperture and a magnification of an exposure device having a minimum resolving power R and used in a process of manufacturing a semiconductor device using said phase-shifting mask, $\lambda$ and $\delta$ represent a wavelength and coherence of light used therein; and $R1 = (m1/m) \cdot R$.

5. A method of inspecting a phase-shifting mask used in an exposure step of a process of manufacturing a semiconductor device, comprising the steps of:

(a) producing first pattern data as a function of a given circuit pattern;

(b) converting said first pattern data into second pattern data used for manufacturing a phase-shifting mask;

(c) manufacturing said phase-shifting mask as a function of said second pattern data;

(d) exposing said phase-shifting mask using optical conditions related to those of said exposure step which makes use of a phase shift method to obtain a pattern for inspection;

(e) imaging said pattern for inspection to obtain image data; and (f) checking said image data with said first pattern data;

wherein said step of transferring said phase-shifting mask is performed using a mask exposure device and comprises:

projecting single-wavelength light using a light source;

introducing said light from said light source onto a mask surface of said phase-shifting mask using a first optical system;

condensing light which passes through said phase-shifting mask onto a resist surface of said masking material using a second optical system; and setting said mask exposure device to satisfy the following relations, $$\lambda 2 = \lambda$$

$$\sigma 2 = \sigma$$

$$m2 \cdot A2 = m \cdot A$$

$$m2 > m$$

where A2 and m2 represent a numerical aperture and a magnification of said mask exposure device, $\lambda 2$ and $\sigma 2$ represent a wavelength and a coherence of said light projected from said light source respectively, while A and m represent a numerical aperture and a magnification of said exposure device used in a process of manufacturing a semiconductor device, $\lambda$ and $\sigma$ represent a wavelength and a coherence of light used therein; and said method further comprises inspecting with an enlarged pattern based on $$R2 = (m2/m) \cdot R;$$

where R2 and R represent minimum resolving powers of said mask exposure device and said exposure device used in a process of manufacturing a semiconductor device, respectively.

6. A method of inspecting a mask of claim 5, wherein said first pattern data are produced by using CAD.

7. A method of inspecting a mask of claim 5, wherein said method further comprises the steps of:

imaging said pattern of said phase-shifting mask by an imaging means which does not produce a phase shift to obtain image data; and checking said image data with said second pattern data.

* * * * *